United States Patent
Guerin et al.

(10) Patent No.: US 9,417,270 B2
(45) Date of Patent: Aug. 16, 2016

(54) SYSTEMS AND METHODS TO CAPTURE AND UTILIZE TEMPERATURE INFORMATION IN A BATTERY SYSTEM

(71) Applicant: GM GLOBAL TECHNOLOGY OPERATONS LLC, Detroit, MI (US)

(72) Inventors: John T. Guerin, Bloomfield, MI (US); Sudhakar Inguva, Troy, MI (US); Rashed S. Rabaa, West Bloomfield, MI (US); Sanjay K. Mahajan, Bloomfield Hills, MI (US); Ramesh Rebba, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 811 days.

(21) Appl. No.: 13/736,803

(22) Filed: Jan. 8, 2013

(65) Prior Publication Data
US 2014/0195179 A1    Jul. 10, 2014

(51) Int. Cl.
*G01R 19/165*     (2006.01)
*G06F 17/00*      (2006.01)
*G01R 31/36*      (2006.01)
*H01M 10/48*      (2006.01)

(52) U.S. Cl.
CPC ...... *G01R 19/16542* (2013.01); *G01R 31/3606* (2013.01); *G06F 17/00* (2013.01); *H01M 10/482* (2013.01); *H01M 10/486* (2013.01); *G01R 31/3651* (2013.01); *G01R 31/3658* (2013.01); *G01R 31/3679* (2013.01)

(58) Field of Classification Search
USPC .......................................................... 702/63
See application file for complete search history.

(56) References Cited

PUBLICATIONS

Ahmad A. Pesaran, Thermal Characteristics of Selected EV and HEV Batteries, Annual Battery Conference: Advances and Applications Long Beach, California Jan. 9-12, 2001, 7 pages.*
A.A. Pesaran , An Approach for Designing Thermal Management Systems for Electric and Hybrid Vehicle Battery Packs, To be presented at the Fourth Vehicle Thermal Management Systems Conference and Exhibition London, UK May 24-27, 1999, 19 pages.*

* cited by examiner

*Primary Examiner* — Tung S Lau
(74) *Attorney, Agent, or Firm* — Phillips Ryther & Winchester; Jared L. Cherry

(57) ABSTRACT

Disclosed herein are various systems and methods for capturing and utilizing temperature information in a battery pack. An electrical measurement system may be configured to determine a subdivision electrical parameter associated with one or more subdivisions, and a thermal measurement system configured to determine and track a thermal parameter associated with one or more subdivisions. A battery model may utilize the thermal parameter and the electrical parameter to estimate a characteristic of one or more battery subdivisions. In some embodiments, the battery model may further estimate a second thermal parameter of a second subdivision based upon a location of the second subdivision within the battery pack and based on the estimated characteristic of a first subdivision. Some embodiments may further estimate a life assessment of one or more subdivisions based at least in part on the subdivision electrical parameter and the thermal parameter.

14 Claims, 8 Drawing Sheets

SYSTEMS AND METHODS TO CAPTURE AND UTILIZE TEMPERATURE INFORMATION IN A BATTERY SYSTEM

TECHNICAL FIELD

The systems and methods disclosed herein relate to capturing temperature variation in a battery system and utilizing such information to control a battery system. More specifically, the systems and methods of the present disclosure relate to monitoring a battery system and utilizing information relating to temperature variation to estimate battery parameters and/or states and to implement control systems utilizing such information.

BACKGROUND

Passenger vehicles often include electric batteries for operating a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system may be used to power electric drivetrain components of the vehicle (e.g., electric drive motors and the like).

The capacity of a battery system included in an electric vehicle ("EV") and plug-in hybrid electric vehicle ("PHEV") may constrain the range of the vehicle. A battery system's state of health ("SOH") is a qualitative measure of a battery's ability to store and deliver electrical energy, while a battery system's state of charge ("SOC") is an estimate of electrical energy stored in the battery. Battery diagnostic and prognostic methods may be used to maintain proper battery operation and to provide a user with an indication of when the battery will become depleted. Battery diagnostics may track the degradation of battery's performance to estimate battery SOH and may track the SOC. Operation of a battery system is dynamic and performance of a battery system varies with age and operating conditions. For example, the capacity of a battery may degrade over the life of the battery.

SUMMARY

Disclosed herein are various systems for capturing and utilizing temperature information in a battery pack. An electrical measurement system may be configured to determine a subdivision electrical parameter associated with one or more subdivisions, and a thermal measurement system may be configured to determine and track a thermal parameter associated with one or more subdivisions. A battery model may utilize the thermal parameter and the electrical parameter to estimate a characteristic of one or more battery subdivisions. In some embodiments, the battery model may further estimate an additional second thermal parameter of another subdivision based upon a location of the second subdivision within the battery pack and based on the estimated characteristic of a first subdivision. Some embodiments may further estimate a life assessment of one or more subdivisions based at least in part on the subdivision electrical parameter and the thermal parameter.

Also disclosed herein are various methods for capturing and utilizing temperature information in a battery pack comprising that includes a plurality of subdivisions. Such methods may include a determination of a subdivision electrical parameter associated with a first subdivision selected from among the plurality of subdivisions, and a determination of a thermal parameter associated with the first subdivision. Based on the subdivision electrical parameter and the thermal parameter, an estimate of a characteristic of the first subdivision may be generated.

According to some embodiments, a system to capture and utilize temperature information in a battery pack may include a battery model configured to receive an electrical parameter input, a control variable input, and a noise variable input. Based on these inputs, the battery model may be configured to generate for at least one subdivision of a plurality of subdivisions a battery model output comprising at least one of a terminal voltage, a terminal power, a temperature, and a state of charge. The system may also include a battery life model configured to receive the battery model output and to generate a battery life model output comprising at least one of a capacity variation, a temperature variation, and a resistance variation over a plurality of charge and discharge cycles of the at least one subdivision. Further, the battery life model output may be provided as an input to the battery model.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
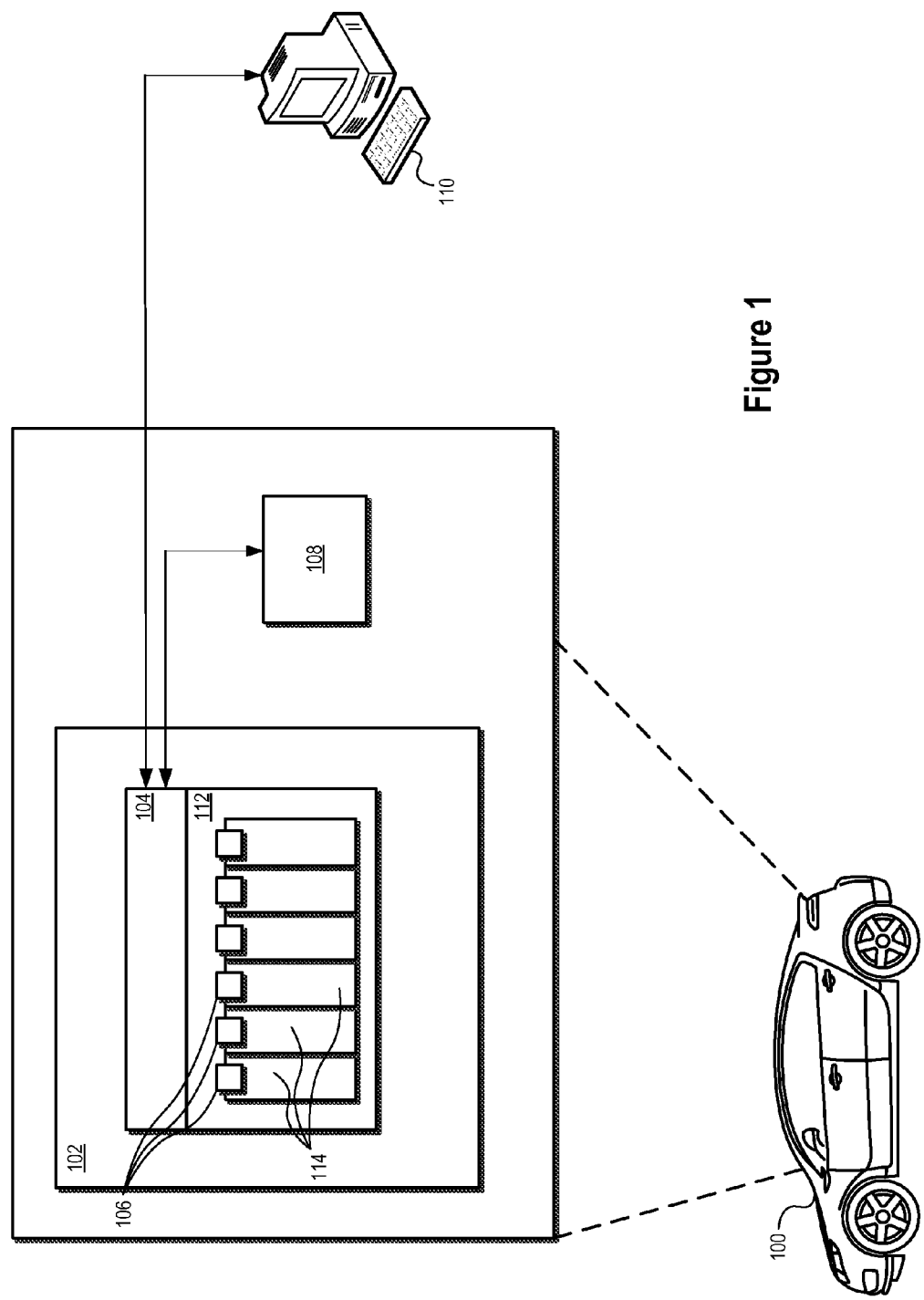
FIG. 1 illustrates an exemplary battery system and control system in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Battery packs for hybrid and purely electric vehicles may include a plurality of subdivisions. For example, a vehicle battery system may include a battery pack that comprises one or more sub-packs or battery cells. The term subdivision, as used herein, may refer to either a sub-pack or a battery cell, or to a plurality of sub-packs or battery cells that together constitute a battery pack.

A battery having a plurality of subdivisions may provide efficiencies in packaging, manufacturability, and serviceability. In battery packs comprising multiple subdivisions, such subdivisions may experience differences in operating conductions, such as temperature, that may impact the performance and/or longevity of the subdivision. In estimating the performance and/or longevity of a battery pack, it may be advantageous to take into account the long term impact of such variations in temperature and the corresponding impact on individual subdivisions.

Temperature is one factor that influences the overall performance of a battery system and the performance of individual subdivisions in the battery system. Performance of the system may refer to the battery system lifespan and other performance metrics relating to battery system characteristics, such as energy storage capacity, battery system voltage, the amount of electrical current that may be generated by the battery system, the state of charge of the battery system, etc. In addition, temperature may impact prognostication, balancing, and diagnostics operations employed by a battery system.

Temperature may influence a battery system in both the short term (e.g., over a small number of charge/discharge cycles) and long term (e.g., over a large number of charge/discharge cycles). For example, if a battery system operates in an extended period of time in an elevated temperature range in comparison to a battery system that operates in a lower temperature range, the performances of the systems will differ. The battery system operating in the warmer environment may exhibit increased capacity relative to the battery system that operates in the colder environment. Further, temperature may also influence performance in the short term. For example, a battery system may exhibit different performance characteristics, such as energy storage capacity, depending on whether the battery system is operated at an ambient temperature of 30° C. or 0° C. In this example, the battery system may exhibit greater performance and greater capacity when operated at an ambient temperature of 25° C. than it may when operated at an ambient temperature of 0° C.

In addition to ambient temperature, a variety of other factors may influence the temperature of battery subdivisions. Such factors may include subdivision air flow quantity, air flow temperature, subdivision position in the air flow path, subdivision location, subdivision type (e.g., battery system chemistry), subdivision geometry, manufacturing variation, debris in an air flow path, etc.

Consistent with embodiments disclosed herein, a battery system may include a measurement system configured to monitor one or more subdivision electrical parameters and one or more thermal parameters associated with one or more of the plurality of subdivisions. Such electrical parameters may include current, voltage, electrical impedance, and the like. Thermal parameters may include a measure of temperature.

Information relating to the capacity of a battery system and individual battery subdivisions may be provided to a control system configured to control various aspects of the battery system. For example, a control system may prevent over-discharge of the battery system and/or over-discharge of one or more individual subdivisions of the battery system. Over-discharge of a battery may result in permanent damage to the battery and, accordingly, mitigating and/or preventing over-discharge of a battery is desirable. Further, given that individual subdivisions in a battery may exhibit differences in capacity, some subdivisions may become over-discharged before other sections are over-discharged and even before the battery as a whole is over-discharged. The control system may further be configured to control charging of the battery system, balancing of the battery system, setting diagnostic parameters, etc.

Systems and methods disclosed herein may be configured to generate a performance assessment of one or more battery subdivisions based upon an electrical parameter associated with a subdivision and a thermal parameter associated with the subdivision. For example, the electrical parameter may include a current measurement and the thermal parameter may include an ambient temperature. These parameters may be inputs for a model operable to determine a temperature of the subdivision.

Assuming that each battery subdivision generates and transfers heat independent of the other subdivisions, a Monte Carlo simulation of a single subdivision may be utilized to capture temperature variation between subdivisions in the battery pack. Variation between subdivisions may be attributable to the location of subdivisions within the battery pack. For example, in an air-cooled battery system, the temperature of a subdivision may vary based upon distance from an air inlet. According to various embodiments, the systems and methods disclosed herein may be utilized to account for variations in temperature among different subdivisions.

Electrical and thermal parameters may also be utilized to estimate or calculate other parameters. For example, according to some embodiments, a cell voltage polarity response may be calculated. According to some embodiments, a battery life model may be configured to estimate a life assessment. The life assessment may also be referred to as the battery's SOH. Still further, according to some embodiments, the electrical resistance of a subdivision and/or a decrease in capacity of a subdivision may be determined.

FIG. 1 illustrates an exemplary battery system and control system in a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be communicatively coupled with one or more sensors 106 (e.g., voltage sensors, current sensors, temperature sensors, and/or the like, etc.) and/or other systems configured to enable the battery control system 104 to monitor and control operations of the battery system 102. For example, sensors 106 may provide battery control system 104 with electrical and/or thermal information associated with one or more of subdivisions 114.

The battery control system 104 may further be configured to provide information to and/or receive information from other systems included in the vehicle 100. For example, the battery control system 104 may be communicatively coupled with an internal vehicle computer system 108 and/or an external computer system 110 (e.g., via a wireless telecommunications system or the like). In certain embodiments, the battery control system 104 may be configured, at least in part, to provide information regarding the battery system 102 to a user of the vehicle 100, vehicle computer system 108, and/or external computer system 110. Such information may include, for example, battery state of charge information, battery operating time information, battery operating temperature information, and/or any other information regarding the battery system 102.

The battery system 102 may include one or more battery packs 112 suitably sized to provide electrical power to the vehicle 100. Each battery pack 112 may include one or more subdivisions 114. The subdivisions 114 may comprise sub-packs, each of which may comprise one or more battery cells utilizing any suitable battery technology. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other suitable battery technologies.

Each subdivision 114 may be associated with a sensor 106 configured to measure one or more electrical parameters (e.g., voltage, current, impedance, state of charge, etc.) and/or thermal parameters (e.g., temperature) associated with each battery subdivision 114. Additional sensors may be provided that are configured to provide information about other parameters, such as the temperature of an air inlet in an air-cooled battery system. Although FIG. 1 illustrates separate sensors 106 associated with each battery section 114, in some embodiments a sensor configured to measure various electrical parameters associated with a plurality of subdivisions 114 may also be utilized. The electrical parameters measured by sensor 106 may be provided to battery control system 104. Using the electrical parameters, battery control system 104 and/or any other suitable system may coordinate the operation of battery system 102.

In certain embodiments, information regarding battery charging, discharging, balancing, prognostic, and/or diagnostic operations may be provided by battery control system 104 to vehicle computer system 108, and/or external computer system 110. For example, an indication regarding differences between various subdivisions 114 may be provided. Such differences may include, for example, variations in the voltage or temperature of each subdivision 114, differences in the amount of current that can be sourced from each subdivision 114, differences in the capacity of each subdivision 114, etc. With this information, a user of the vehicle 100 and/or external computer system 110 may diagnose potential problems with battery system 102. Further, such information may be utilized by battery control system 104 to optimize the operation of battery system 102. Subdivisions 114 exhibiting undesirable characteristics may be replaced in order to prolong the useful life of battery system 102 as a whole.

Figure 2:
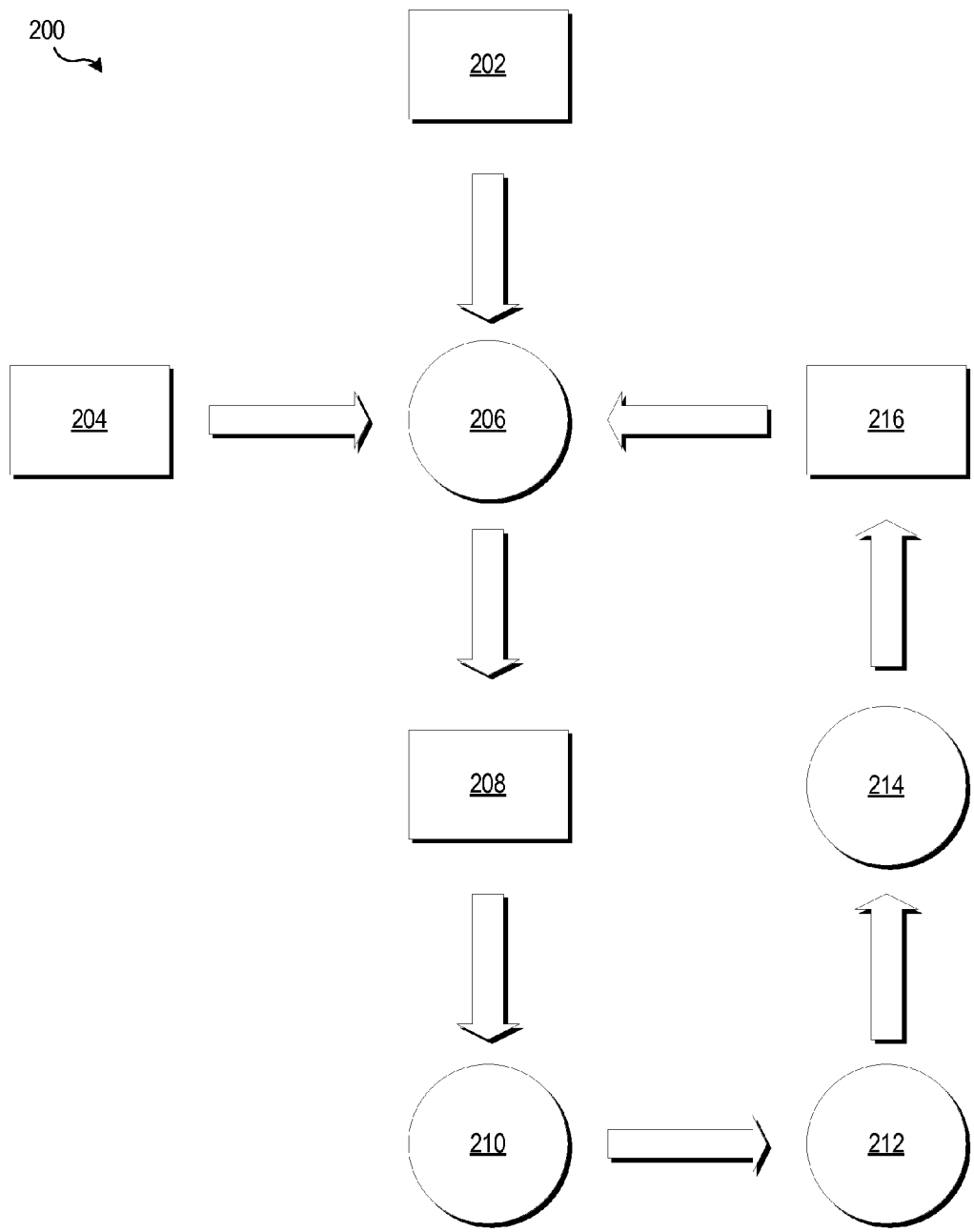
FIG. 2 is a conceptual representation of a system to capture and utilize temperature information in a battery system consistent with embodiments disclosed herein.

FIG. 2 is a conceptual representation of a system 200 to capture and utilize temperature information in a battery system. Specifically, FIG. 2 illustrates the inputs and outputs of a battery model 206, a battery life model 210, and a cell resistance and heat transfer coefficient model 214.

Battery model 206 may receive as inputs control variables 202, inputs 204, and noise variables 216. Battery model 206 may be configured to generate one or more outputs 208 representing the response of a battery system to the illustrated inputs. According to some embodiments, control variables 202 may include a nominal air flow rate. Inputs 204 may include information about the electrical current profile. Such information may be provided by an electrical measurement system, according to some embodiments. Noise variables 216 may include a variety of measured or calculated values that account for noise in system 200. According to some embodiments, noise variables 216 may comprise subdivision electrical resistance values and/or heat transfer coefficients.

Battery model 206 may generate outputs 208 representing one or more battery parameters. Such outputs 208 may include a terminal voltage, a terminal power, and/or a temperature. According to some embodiments, outputs 208 may represent only one battery subdivision, while according to other embodiments, outputs 208 may represent all subdivisions of a battery system. Battery model 206 may be embodied in a variety of physical modeling and/or simulation platforms. According to some embodiments, battery model 206 may be a proprietary model configured to operate using computational resources available provided by a vehicle's onboard computer. According other embodiments, battery model 206 may be embodied as a general purpose modeling and simulating model. For example, the Saber platform available from Synopsys, Inc. of Mountain View, Calif., may serve as a platform for implementing battery model 206.

Figure 6:
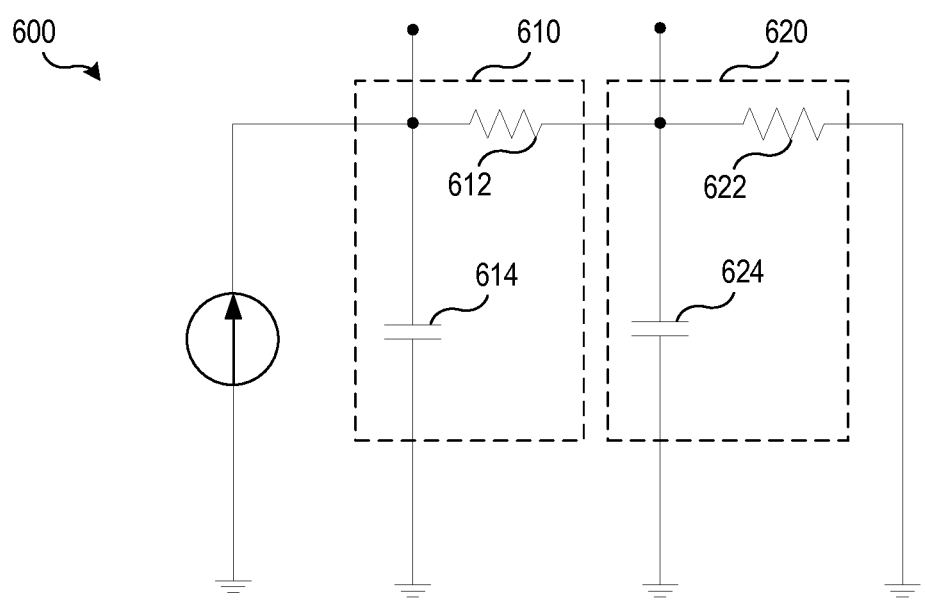
FIG. 6 illustrates a two resistor-capacitor circuit that may be used for modeling the thermal response of a battery subdivision consistent with various embodiments disclosed herein.

According to certain embodiments, battery model 206 may include a particle filter method and/or a Sequential Monte Carlo method. Embodiments based upon the Sequential Monte Carlo method may rely upon on repeated random sampling of parameters used to simulate the battery system. Using measurements from the battery system for comparison, successive iterations may yield increasingly accurate estimations of the battery system. Improvements in the accuracy of the estimations may be attributed to tuning a variety of battery parameters in successive iterations of an algorithm. The Sequential Monte Carlo method may model a single subdivision using a plurality of samples, and may be configured to model a thermal response of the subdivision. According to some embodiments, the subdivision may be modeled as a two resistor-capacitor thermal network. An exemplary embodiment of a two resistor-capacitor thermal network is illustrated in FIG. 6, and described in greater detail below.

Returning to a discussion of FIG. 2, battery life model 210 may receive as an input the outputs 208 from battery model 206. Battery life model 210 may generate as an output one or more indications of the life or SOH of a battery system. Similar to battery life model 206, battery life model 210 may be embodied in a variety of physical modeling and/or simulation platforms. According to some embodiments, battery life model 210 may be a proprietary model configured to operate using computational resources available provided by a vehicle's onboard computer. According other embodiments, battery life model 210 may be embodied as a general purpose modeling and simulating model. For example, the Simulink platform available from MathWorks, Inc. of Natick, Mass., may serve as a platform for implementing battery life model 210.

Battery life model 210 may provide an indication of the life and/or SOH of a battery system to a resistance rise and capacity degradation model 212. Resistance rise and capacity degradation model 212 may generate an output that represents a rise in the electrical resistance of one or more subdivisions and/or a decrease in capacity of the subdivision.

The output of the resistance rise and capacity degradation model 212 may be provided to cell resistance and heat transfer coefficient model 214. Cell resistance heat transfer coefficient model 214 may generate an estimate of the subdivision resistance and a heat transfer coefficient. The heat transfer coefficient may be derived from the geometry of a particular battery subdivision, coolant flow rate, and coolant temperature. The capacity degradation and resistance increase may be derived from either an independent or integrated life model of one or more subdivisions of the battery. In one embodiment, the life model may utilize a lookup table in order to estimate the capacity degradation and resistance increase of a battery subdivision. Alternative techniques for determining the capacity degradation and resistance increase of a battery subdivision may also be incorporated in various embodiments consistent with the present disclosure. The output of cell resistance and heat transfer coefficient model 214 may constitute noise variables 216.

Figure 3:
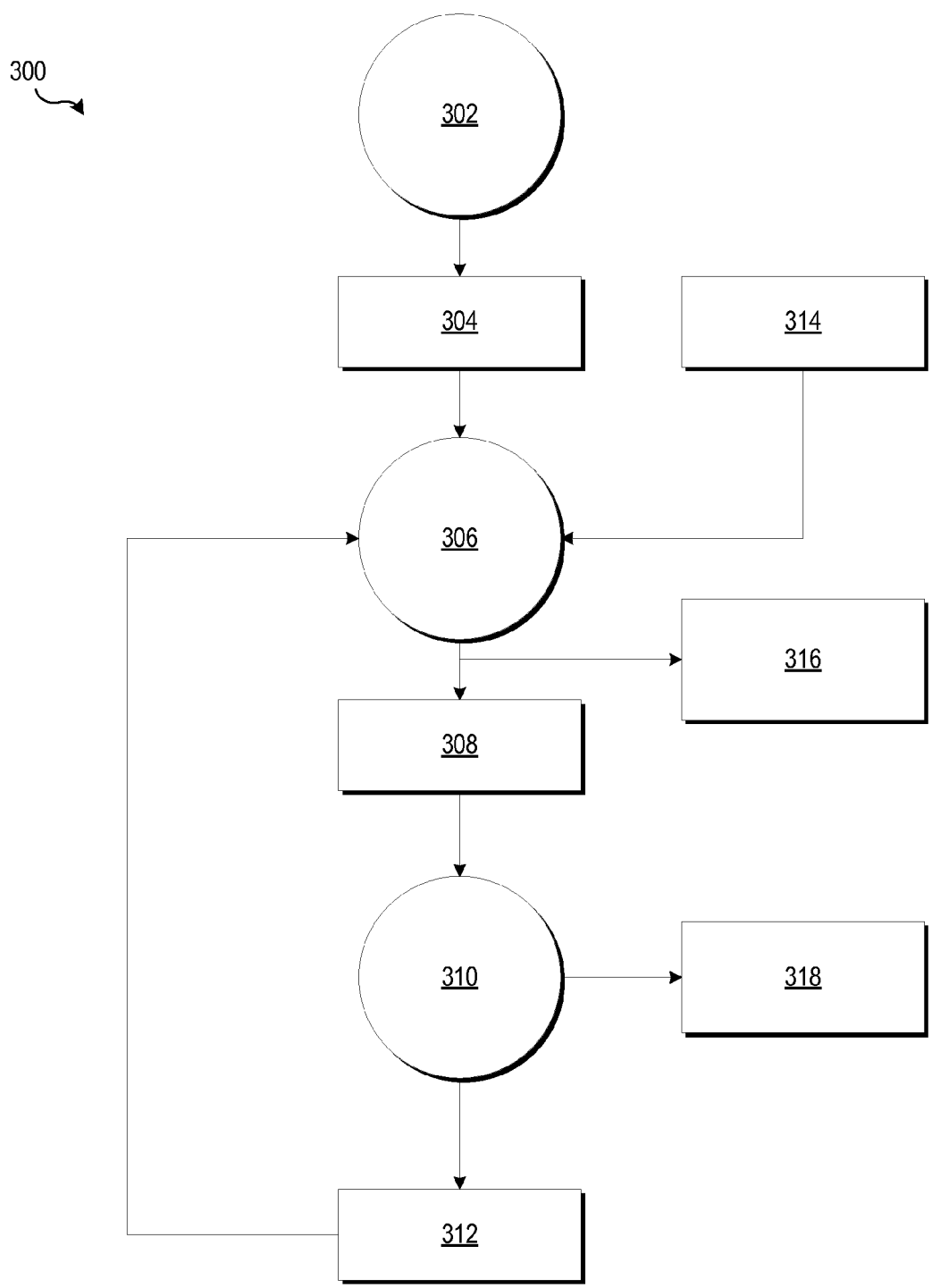
FIG. 3 illustrates a conceptual representation of a system to capture and utilize temperature information in a battery system consistent with embodiments disclosed herein.

FIG. 3 illustrates a conceptual representation of a system 300 to capture and utilize temperature information in a battery system, according to some embodiments. System 300 incorporates a thermal model 302 that may be used to generate heat transfer coefficients 304.

A battery model 306 may receive as inputs one or more of heat transfer coefficients 304, a load profile 314, and capacity and resistance values 312. Battery model 306 may be configured to simulate the response of a battery system to the inputs 304, 312, 314. Battery model 306 may generate as an output a cell voltage SOC and a diagnostic limit 316, which may be utilized in connection with prognostication and/or diagnostic assessment of a battery system. In addition, battery model 306 may generate outputs 308, which may include a temperature and power estimate of a battery subdivision. As discussed in connection with battery model 206, above, battery model 306 may be implemented using a variety of simulation and/or modeling techniques and programs.

Outputs 308 from battery model 306 may serve as inputs to battery subdivision life module 310. Battery subdivision life model 310 may generate output 312 and 318. Output 312 may be fed back into battery model 306 as part of a closed-loop system. Output 312 may include an estimate of the capacity of one or more battery subdivisions and an estimate of the electrical resistance of one or more battery subdivisions. In addition, output 318 may include an estimate of the capacity, resistance, and/or temperature variation of a battery subdivision over its lifespan.

Figure 4:
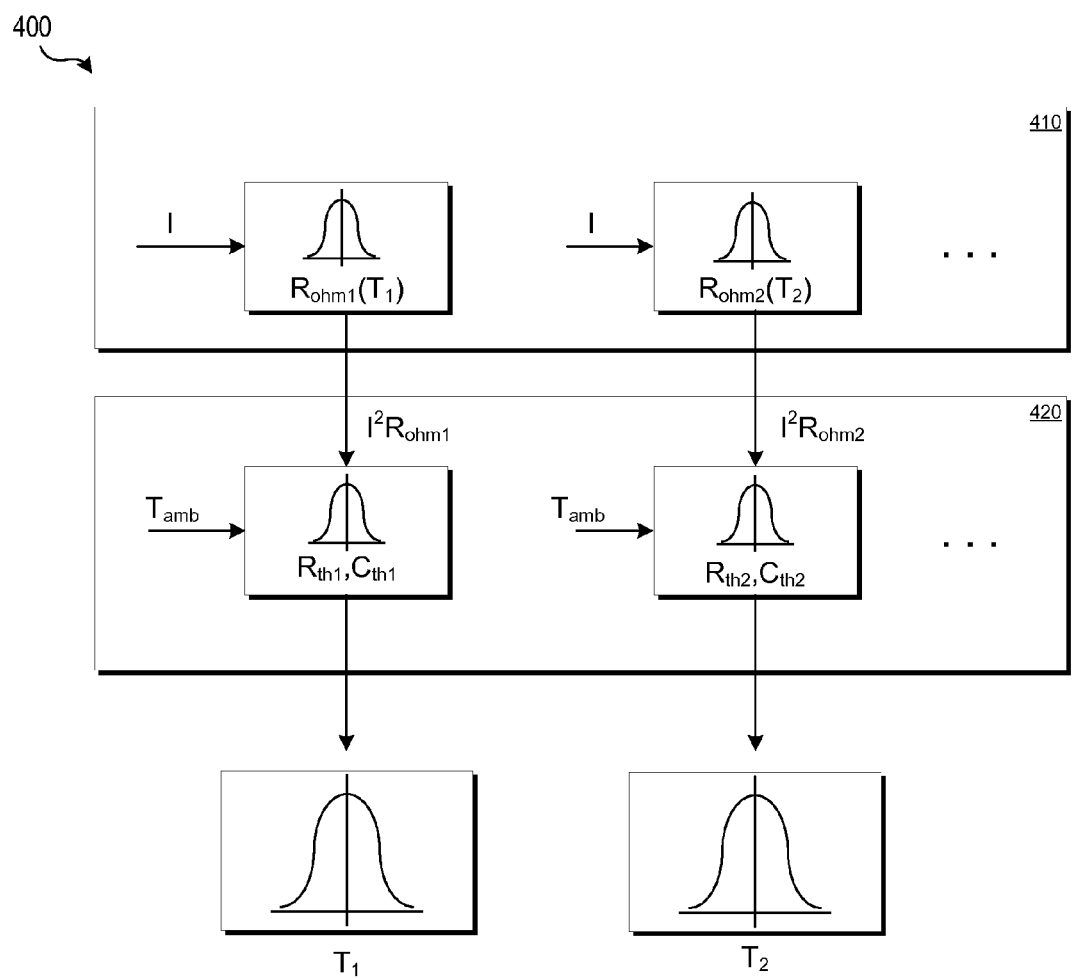
FIG. 4 illustrates a conceptual representation of a thermal model that may be utilized in connection with various embodiments disclosed herein.

FIG. 4 illustrates a conceptual representation of a thermal model 400 that may be utilized in connection with various embodiments disclosed herein. Thermal model 400 may take into account any number of battery subdivisions, although only two are illustrated in FIG. 4. A first stage 410 of model 400 may receive as an input the current provided by individual cell subdivisions and may generate an output of the power associated with each subdivision according to Eq. 1.

$$\text{Power} = I^2 R_{Ohm_n} + \text{Heat of Reaction} \quad \text{Eq. 1}$$

In Eq. 1, $R_{Ohm_n}$ is the ohmic resistance of a battery subdivision. The heat of reaction may encompass all sources of heat generation within a battery subdivision, including the thermal energy generated by the electrochemical reaction in the battery subdivisions. The power calculated according to Eq. 1 maybe an input to a second stage 420 of model 400, which may also take into account and ambient temperature, $T_{amb}$.

The temperature, T of a subdivision, n, may be calculated as a function of the parameters shown in Eq. 2.

$$T_n = f(R_n, I, R_{ohm}, C_n) \quad \text{Eq. 2}$$

The function relating temperature to the input may vary based on subdivision type, subdivision geometry, subdivision chemistry, etc. If it can be assumed that each battery system subdivision generates and transfers heat independent of the other battery system subdivisions, a Monte Carlo simulation on a single subdivision may be used to capture temperature variation between subdivisions in the battery pack. If the independence is not apparent, then the simulation on multiple subdivisions may be performed according to certain embodiments.

Figure 5:
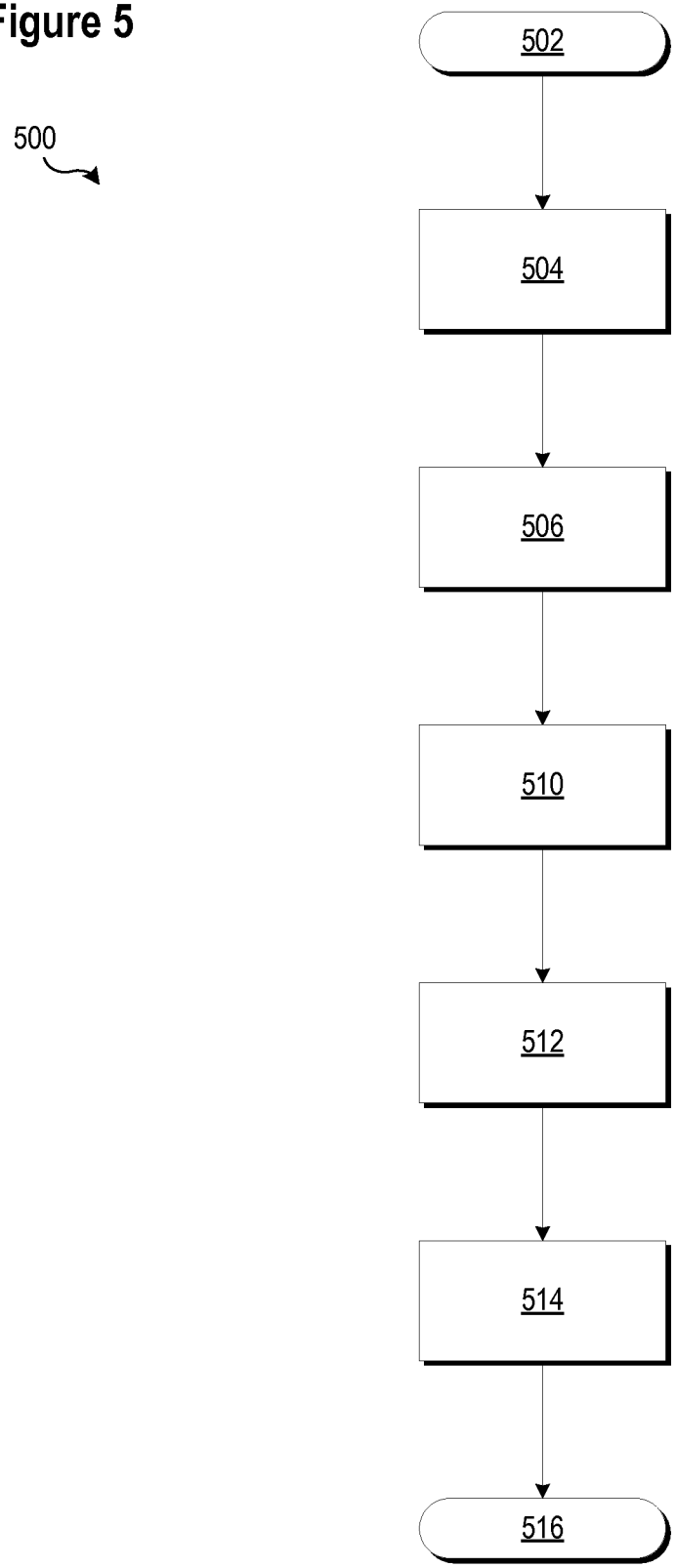
FIG. 5 illustrates a flow chart of an exemplary method for capturing and utilizing temperature information in a battery pack including a plurality of subdivisions consistent with various embodiments disclosed herein.

FIG. 5 illustrates a flow chart of an exemplary method 500 for capturing and utilizing temperature information in a battery pack comprising a plurality of subdivisions. Method 500 may begin at 502. At 504, method 500 may determine a subdivision electrical parameter associated with a battery subdivision. The battery subdivision may be selected from among a plurality of subdivisions in a battery pack. According to some embodiments, the electrical parameter may include a voltage measurement, a current measurement, an impedance measurement, and the like.

At 506, a thermal parameter associated with the subdivision may be determined. The thermal parameter may be measured or calculated. For example, according to some embodiments, the thermal parameter may be determined by a temperature sensor associated with the subdivision. According to further embodiments, the thermal parameter may be calculated based upon one or more parameters. Such parameters may include, for example, Ohmic resistance, current flow, airflow, etc.

At 510, method 500 may generate an estimated battery characteristic of the subdivision based on the subdivision electrical parameter and the thermal parameter. According to various embodiments, the characteristic may comprise a state of charge, a temperature, and/or a terminal voltage. The characteristic may be applicable to a single subdivision, may be applicable to a plurality of subdivisions, or may be applicable to all subdivisions in the battery pack.

Method 500 may optionally determine at 512 a spatial temperature variation of one or more subdivisions in the battery pack. In other words, method 500 may determine variations among subdivision in a battery pack. For example, in an air-cooled battery system, the temperature of a subdivision may vary based upon distance from an air inlet. In other examples, the location or spatial configuration of subdivisions within a battery pack may lead to uneven temperature distributions between different subdivisions.

At 514, a life assessment may be generated based at least in part on the subdivision electrical parameter and the thermal parameter. The life assessment may represent a SOH of a battery pack and/or one or more subdivisions within a battery pack. The SOH or life assessment may be expressed in a number of ways. For example, the life assessment may be expressed as a percentage representing a current energy storage capacity with respect to a maximum energy capacity or a battery pack. Further, the life assessment may be expressed as an increase in internal resistance of a subdivision. In certain embodiments, there may be an inverse relationship between the internal resistance of a subdivision and the energy storage capacity of a subdivision. Method 500 may terminate at 516.

FIG. 6 illustrates a two resistor-capacitor circuit 600 that may be used for modeling the thermal response of a battery subdivision. Circuit 600 may include resistor-capacitor circuit 610 and resistor-capacitor circuit 620. Resistor-capacitor circuit 610 includes a resistor 612 and a capacitor 614, and resistor-capacitor circuit 620 includes a resistor 622 and a capacitor 624. The capacitance values of capacitors 614 and 624 and the resistance values of resistors 612 and 622 may be tuned in order match and/or approximate physical parameters of circuit 600 to the physical response of a system being modeled. According to some embodiments a plurality of simulations may be run using different values of capacitors 614 and 624 and resistors 612 and 622 in order to tune the response of the circuit 600. In certain embodiments, a Sequential Monte Carlo method may be used to tune the parameters.

Figure 7:
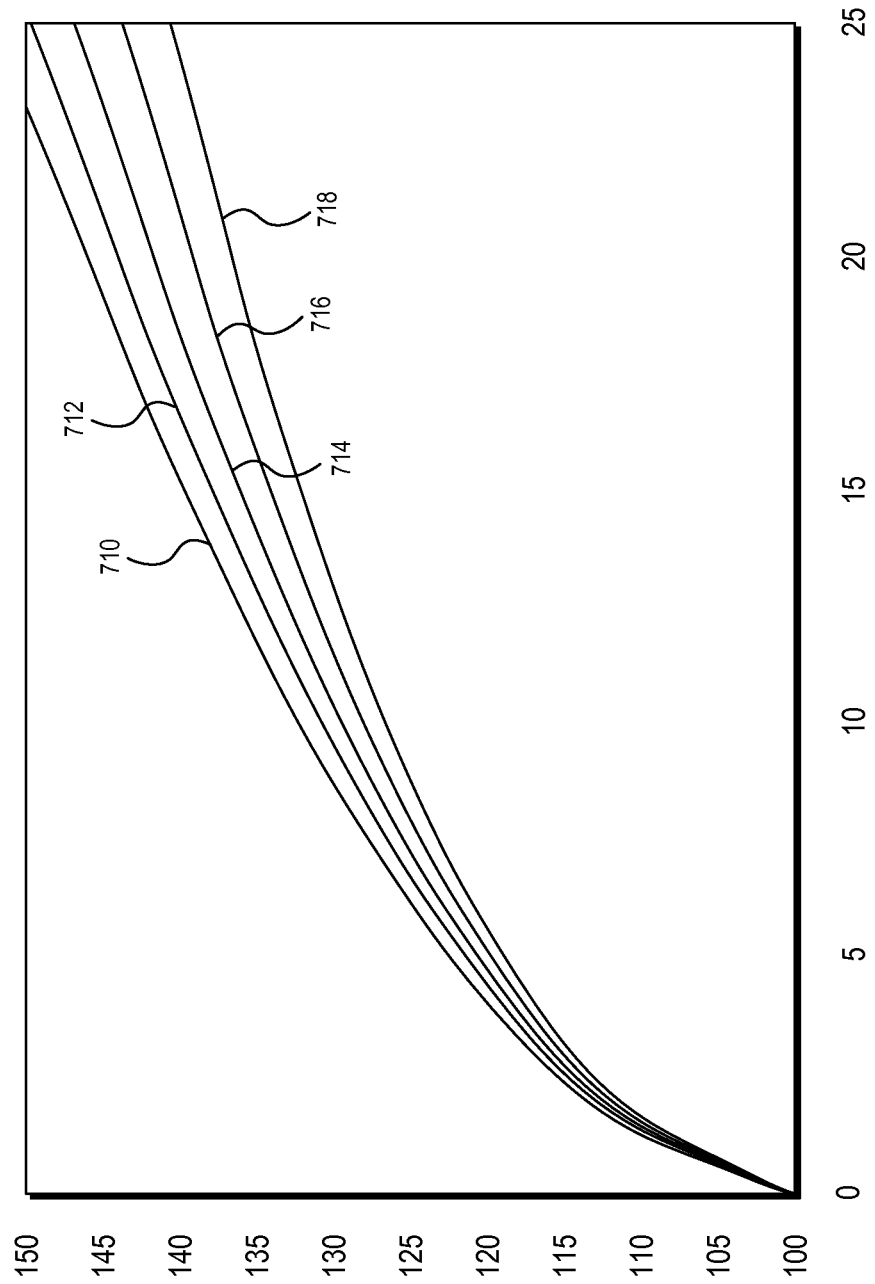
FIG. 7 is a graph showing the resistance of an exemplary battery subdivision over time at a plurality of temperatures consistent with various embodiments disclosed herein.

FIG. 7 is a graph showing the resistance of an exemplary battery subdivision over time at a plurality of temperatures. The resistance is expressed as a ratio of a current resistance to an initial resistance. According to graph shown in FIG. 7, the time is shown in years. Each of lines 710, 712, 714, 716, and 718 represent a different average operating temperature. A higher average temperature may result over time in lower internal resistance (e.g., line 718), while a lower average temperature may result over time in a higher internal resistance (e.g., line 710). A battery pack or battery subdivision may have a higher average temperature when the battery system operates in a warm climate, and may have a lower average temperature when the battery system operates in a cooler climate.

According to one embodiment, the temperature variation over time shown in FIG. 7 may be taken into account by a control system configured to control various aspects of operation of a battery system. Temperature data may be collected over time and used by the control system in order to estimate characteristics and/or parameters of the battery system or battery subdivision. According to some embodiments, for example, temperature data may be collected over a time period comprising a plurality of charge and discharge cycles. According to some embodiments, temperature data may be collected over the entire lifetime of the battery or battery subdivision.

Figure 8:
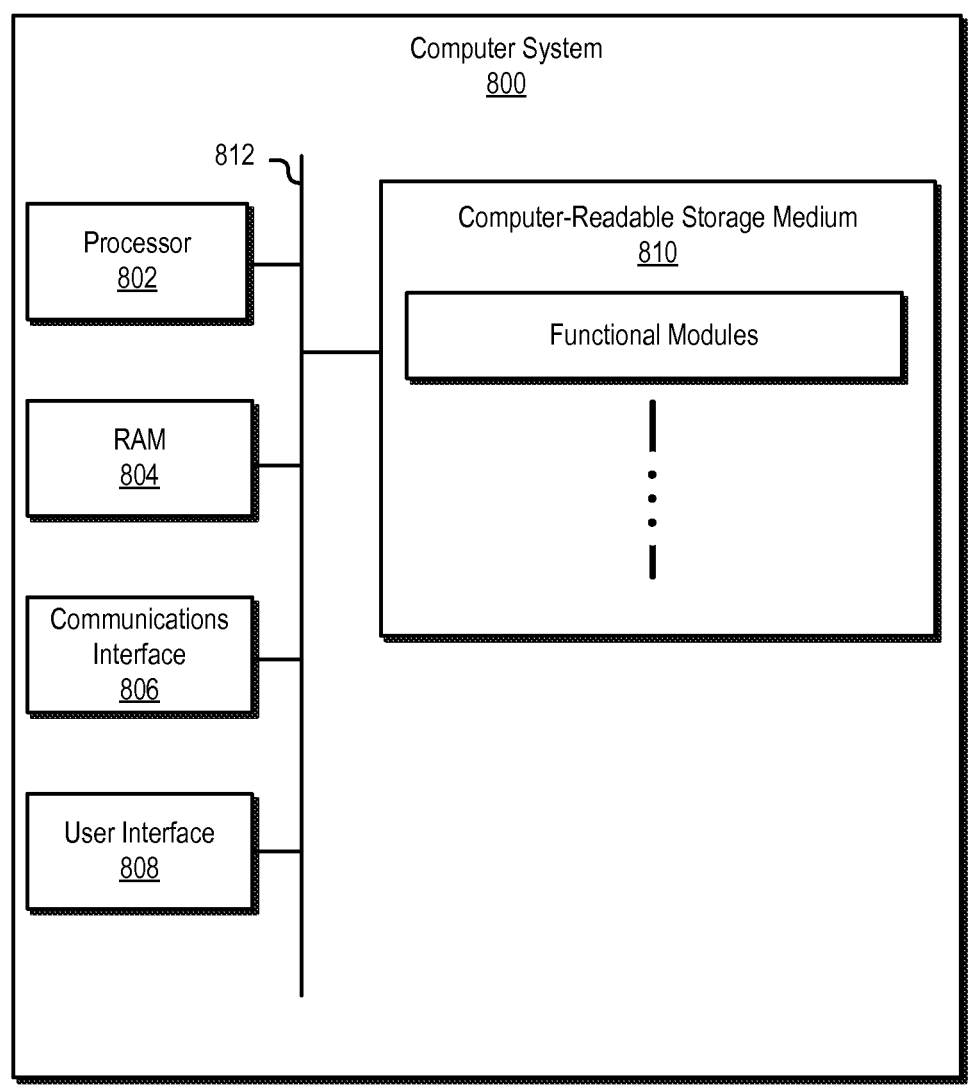
FIG. 8 illustrates a block diagram of a computer system for implementing certain embodiments of the present disclosure.

FIG. 8 illustrates a block diagram of a computer system 800 for implementing certain embodiments of the systems and methods disclosed herein. In certain embodiments, the computer system 800 may be a personal computer system, a server computer system, and/or any other type of system suitable for implementing the disclosed systems and methods. In further embodiments, the computer system 800 may be any portable electronic computer system or electronic device including, for example, a notebook computer, a smartphone, and/or a tablet computer.

As illustrated, the computer system 800 may include, among other things, one or more processors 802, random access memories (RAM) 804, communications interfaces 806, user interfaces 808, and/or non-transitory computer-readable storage mediums 810. The processor 802, RAM 804, communications interface 806, user interface 808, and computer-readable storage medium 810 may be communicatively coupled to each other via a common data bus 812. In some embodiments, the various components of the computer system 800 may be implemented using hardware, software, firmware, and/or any combination thereof.

The user interface 808 may include any number of devices allowing a user to interact with the computer system 800. For example, user interface 808 may be used to display an interactive interface to a user, including any of the visual interfaces disclosed herein. The user interface 808 may be a separate interface system communicatively coupled with the computer system 800 or, alternatively, may be an integrated system such as a display interface for a laptop or other similar device. In certain embodiments, the user interface 808 may be produced on a touch screen display. The user interface 808 may also include any number of other input devices including, for example, keyboard, trackball, and/or pointer devices.

The communications interface 806 may be any interface capable of communicating with other computer systems and/or other equipment (e.g., remote network equipment) communicatively coupled to computer system 800. For example, the communications interface 806 may allow the computer system 800 to communicate with other computer systems (e.g., computer systems associated with external databases and/or the Internet), allowing for the transfer as well as reception of data from such systems. The communications interface 806 may include, among other things, a modem, an Ethernet card, and/or any other suitable device that enables the computer system 800 to connect to databases and networks, such as LANs, MANs, WANs and the Internet.

The processor 802 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

The processor 802 may be configured to execute computer-readable instructions stored on the non-transitory computer-readable storage medium 810. Computer-readable storage medium 810 may store other data or information as desired. In some embodiments, the computer-readable instructions may include computer executable functional modules. For example, the computer-readable instructions may include one or more functional modules configured to implement all or part of the functionality of the systems and methods described above. Specific functional models may be included that correspond to the battery model, a thermal network model, a battery life model, a cell resistance and heat transfer coefficient model, a resistance rise and capacity degradation model, and the like.

The system and methods described herein may be implemented independent of the programming language used created the computer-readable instructions and/or any operating system operating on the computer system 800. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 800 may be in response to user commands, results of previous processing, or a request made by another processing machine. It will be appreciated that computer system 800 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. For example, in certain embodiments, the state of charge sensors may be configured to also incorporate features allowing measurement of internal battery section resistances. Similarly, the battery control system may be configured to incorporate certain features and/or functionality of the cell balancing system. Similarly, certain features of the embodiments disclosed herein may be configured and/or combined in any suitable configuration or combination. Additionally, certain systems and/or methods disclosed herein may be utilized in battery systems not included in a vehicle (e.g., a backup power battery system or the like). It is noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus.

Those having skill in the art will appreciate that many changes may be made to the details of the above-described embodiments without departing from the underlying principles of the invention. The scope of the present invention should, therefore, be determined only by the following claims.

The invention claimed is:

1. A system to capture and utilize temperature information in a battery pack comprising a plurality of subdivisions, the system comprising:
   a battery pack comprising a plurality of subdivisions;
   an electrical measurement system in electrical communication with the battery pack and configured to determine a subdivision electrical parameter associated with a first subdivision selected from among of the plurality of subdivisions;
   a thermal measurement system in thermal communication with the battery pack and configured to determine and track a thermal parameter associated with the first subdivision over a plurality of charge and discharge cycles of the battery pack; and
   a battery model configured to estimate a characteristic of the first subdivision based at least in part upon the subdivision electrical parameter, the thermal parameter, and a geometry of the first subdivision, to estimate a second thermal parameter of a second subdivision based upon a location of the second subdivision within the battery pack and based on the estimated characteristic of the first subdivision and to estimate a subdivision life variation between the first subdivision and the second subdivision;
   wherein the battery model comprises a Monte Carlo simulation.

2. The system of claim 1, wherein the battery model is further configured to estimate a cell voltage polarity response of the first subdivision.

3. The system of claim 1, wherein the thermal parameter comprises data associated with a plurality of charge and discharge cycles of the battery pack.

4. The system of claim 1, wherein the Monte Carlo simulation comprises a single cell model with a plurality of samples.

5. The system of claim 1, wherein the characteristic comprises one of a subdivision temperature and a subdivision terminal voltage.

6. The system of claim 1, further comprising a battery life model configured to estimate a life assessment of the first subdivision based at least in part on the subdivision electrical parameter and the thermal parameter.

7. The system of claim 1, wherein each of the plurality of subdivisions comprises one or more battery cells.

8. The system of claim 1, wherein the characteristic comprises a state of charge of the first subdivision.

9. The system of claim 5, wherein the life assessment comprises one of an estimate of an increase in electrical resistance of the subdivision and a decrease in capacity of the subdivision.

10. The system of claim 5, wherein the increase in electrical resistance comprises an annual increase and annual decrease in capacity.

11. The system of claim 8, further comprising:
    a control system configured to receive the state of charge of the first subdivision and to control discharge of the battery system based on the state of charge.

12. A method of capturing and utilizing temperature information in a battery pack comprising a plurality of subdivisions, the method comprising:
    providing a battery pack comprising a plurality of subdivisions;
    determining a subdivision electrical parameter associated with a first subdivision selected from among of the plurality of subdivisions;
    determining and tracking a thermal parameter associated with the first subdivision over a plurality of charge and discharge cycles of the battery pack;
    generating an estimate of a characteristic of the first subdivision based at least in part on the subdivision electrical parameter, the thermal parameter, and a geometry of the first subdivision; an estimate of a second thermal parameter of a second subdivision based upon a location of the second subdivision within the battery pack and based on the estimated characteristic of the first subdivision; and
    estimating a subdivision life variation between the first subdivision and the second subdivision;
    wherein generating the estimate of the characteristic of the first subdivision comprises using a Monte Carlo simulation.

13. The method of claim 12, further comprising estimating a cell voltage polarity response of one or more of the first subdivision.

14. A system to capture and utilize temperature information in a battery pack comprising a plurality of subdivisions, the system comprising:
    a battery pack comprising a plurality of subdivisions;

an electrical measurement system configured to determine a subdivision electrical parameter associated with a first subdivision selected from among the plurality of subdivisions;
a thermal measurement system configured to determine and track a thermal parameter associated with a subdivision over a plurality of charge and discharge cycles of the battery pack;
a battery model configured to estimate a temperature rise of the first subdivision based at least in part on a two resistor-capacitor thermal network model and a geometry of the first subdivision; and
a control system configured to receive the temperature rise of the first subdivision and to estimate a state of charge of the subdivision based at least in part on the temperature rise;
wherein the battery model comprises a Monte Carlo simulation.

* * * * *